United States Patent
Shank et al.

(10) Patent No.: US 9,991,155 B2
(45) Date of Patent: Jun. 5, 2018

(54) LOCAL TRAP-RICH ISOLATION

(71) Applicant: GLOBALFOUNDRIES, INC., Grand Cayman (KY)

(72) Inventors: Steven M. Shank, Jericho, VT (US); Michel Abou-Khalil, Essex Junction, VT (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days. days.

(21) Appl. No.: 15/281,418

(22) Filed: Sep. 30, 2016

(65) Prior Publication Data

US 2018/0096884 A1 Apr. 5, 2018

(51) Int. Cl.
*H01L 21/762* (2006.01)
*H01L 21/84* (2006.01)
*H01L 27/12* (2006.01)

(52) U.S. Cl.
CPC .. *H01L 21/76286* (2013.01); *H01L 21/76283* (2013.01); *H01L 21/84* (2013.01); *H01L 27/1207* (2013.01)

(58) Field of Classification Search
None
See application file for complete search history.

(56) References Cited

U.S. PATENT DOCUMENTS

| | | |
|---|---|---|
| 6,096,621 A | 8/2000 | Jennings |
| 8,772,902 B2 | 7/2014 | Assefa et al. |
| 8,815,700 B2 | 8/2014 | Hopper et al. |
| 2005/0247966 A1* | 11/2005 | Adkisson ......... H01L 27/10841 257/301 |
| 2016/0035899 A1 | 2/2016 | Stulemeijer et al. |
| 2016/0093523 A1 | 3/2016 | Jaffe et al. |

* cited by examiner

*Primary Examiner* — Jay C Chang
(74) *Attorney, Agent, or Firm* — Scully Scott Murphy and Presser; Frank Digiglio

(57) ABSTRACT

A trap-rich polysilicon layer is interposed between the active (SOI) layer and the underlying handle portion of a semiconductor substrate to prevent or minimize parasitic surface conduction effects within the active layer and promote device linearity. In various embodiments, the trap-rich layer extends vertically through a portion of an isolation layer and laterally therefrom between the isolation layer and the handle portion of the substrate to underlie a portion of the device active area.

11 Claims, 14 Drawing Sheets

LOCAL TRAP-RICH ISOLATION

BACKGROUND

The present application relates generally to semiconductor devices, and more specifically to the integration of semiconductor structures such as switch field effect transistors into radio frequency (RF) devices.

Wireless communications use an antenna to transmit and receive electromagnetic (EM) signals. The antenna is typically driven by an integrated circuit (IC) or other discrete device. This IC or driver chip may be configured within a package on a printed circuit (PC) board, for example, along with other circuitry. The EM signal from the driver chip reaches the antenna via internal wiring or other metallization.

There is an increasing demand for compact radio communications systems having integrated transmitter, receiver, transceiver and antenna systems, which enable high data transmission rates, high volume, low power consumption, low weight, and low cost. As operating frequencies increase, the manufacture and assembly of such systems becomes increasingly difficult due to the requirements of high-precision machining and accurate alignment.

Radio frequency devices, including devices operating at 1 GHz and greater, are beneficially integrated directly onto a semiconductor substrate such as a semiconductor-on-insulator (SOI) substrate. However, voltage imbalances caused by substrate loss as well as floating-body and parasitic capacitance effects between input and output electrodes can contribute adversely to the non-linearity of a semiconductor-on-insulator FET switch.

It would be advantageous to provide a method and structure for providing RF isolation to minimize or eliminate parasitic capacitance in switch FETs and other device types to meet linearity specifications.

SUMMARY

In accordance with embodiments of the present application, a method of manufacturing a semiconductor device includes forming an isolation trench through a first semiconductor layer of a semiconductor substrate and partially through an isolation layer that underlies the first semiconductor layer. Sidewalls spacers are formed within the isolation trench, and a lateral cavity extending from the isolation trench is formed within the isolation layer between a portion of the isolation layer and a second semiconductor layer that underlies the isolation layer. A polysilicon layer such as a trap-rich polysilicon layer is formed within the isolation trench and the lateral cavity.

In related embodiments, a semiconductor device includes a doped semiconductor layer disposed over an isolation layer of a semiconductor substrate, and a polysilicon layer embedded within the isolation layer, where the polysilicon layer is peripheral to and only partially underlies the doped semiconductor layer.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
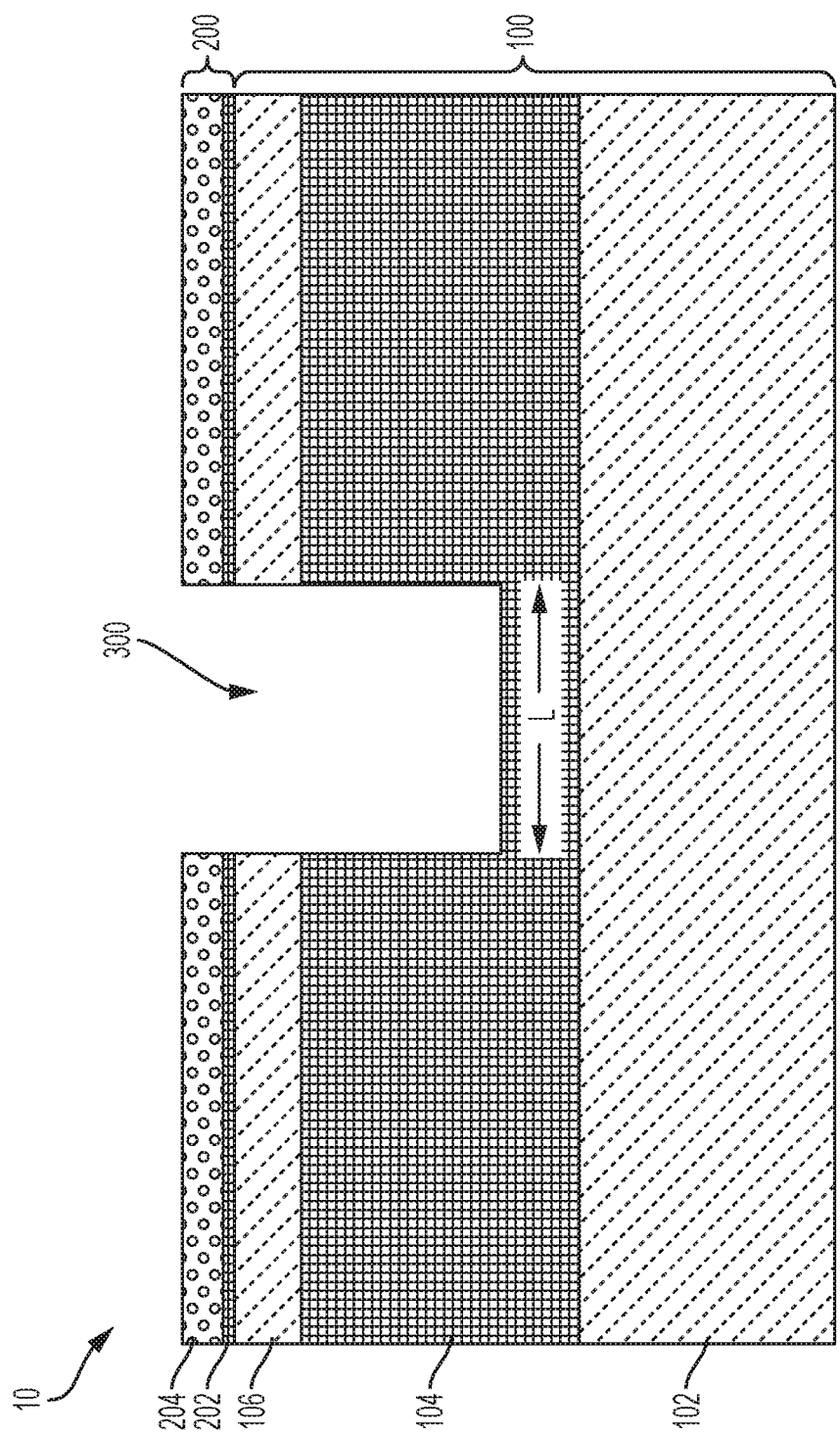
FIG. 1 is a schematic cross-sectional view of a semiconductor-on-insulator (SOI) substrate including an isolation trench formed therein according to various embodiments.

Reference will now be made in greater detail to various embodiments of the subject matter of the present application, some embodiments of which are illustrated in the accompanying drawings. The same reference numerals will be used throughout the drawings to refer to the same or similar parts.

Disclosed is a semiconductor device formed on a semiconductor substrate such as an SOI substrate or an oxidized bulk substrate having a trap-rich polysilicon layer embedded within the substrate. The trap-rich polysilicon layer is formed peripheral to the device, i.e., peripheral to the active region of the device, and also partially underlies the active region to provide both vertical and horizontal isolation. In certain embodiments, the trap-rich layer is disposed within an isolation trench that extends through an isolation layer of the substrate and around the active region of the device. The trap-rich layer also extends laterally from the base of the isolation trench between the isolation layer and the handle portion of the substrate to underlie a portion of the active device region. An example method of forming the locally isolated device architecture is described herein with reference to FIGS. 1-8.

Referring to FIG. 1, a cross sectional view of a structure 10 is shown. The structure 10 includes a semiconductor substrate 100 such as a semiconductor-on-insulator (SOI) substrate, which in the illustrated embodiment includes an SOI (semiconductor) layer 106 separated from a handle portion 102 by an isolation layer 104.

The semiconductor substrate 100 may include a semiconductor material such as silicon or a silicon-containing material. Silicon-containing materials include, but are not limited to, single crystal Si, polycrystalline Si, single crystal silicon germanium (SiGe), polycrystalline silicon germanium, silicon doped with carbon (Si:C), amorphous Si, as well as combinations and multi-layers thereof. Semiconductor substrate 100 is not limited to silicon-containing materials, however, and may include, for example, Ge and compound semiconductors such as SiGe, GaAs, InAs and other like semiconductors.

In various embodiments, the SOI layer 106 may be composed of single crystal semiconductor material such as single crystal silicon. As used herein, the term "single crystal" denotes a crystalline solid, in which the crystal lattice of the entire solid sample is substantially continuous and substantially unbroken to the edges of the sample with substantially no grain boundaries. The SOI layer 106 may be un-doped or doped with n-type dopants, such as for example, phosphorus and arsenic, at a concentration ranging from $1\times10^{16}$ atoms/cm$^3$ to $1\times10^{19}$ atoms/cm$^3$. Alternatively, the SOI layer 106 may be doped with p-type dopants, such as for example, boron, at a concentration ranging from $1\times10^{16}$ atoms/cm$^3$ to $1\times10^{19}$ atoms/cm$^3$. The SOI layer 106 may have a thickness ranging from 10 nm to 300 nm, although greater thicknesses are contemplated.

The isolation layer 104 may comprise the buried oxide (BOX) layer of a semiconductor-on-insulator (SOI) substrate, or an oxidized layer of a bulk silicon substrate. The isolation layer 104 may comprise, for example, silicon dioxide ($SiO_2$). The thickness of the isolation layer 104 may range from 100 to 2000 nm, e.g., 100, 200, 500, 1000, 1500 or 2000 nm, including ranges between any of the foregoing values. The handle portion 102 may comprise (100)-oriented silicon or (111)-oriented silicon, for example.

The substrate 100 may have dimensions as typically used in the art. For instance, the substrate may be a semiconductor wafer. Example wafer diameters include, but are not limited to, 50, 100, 150, 200, 300 and 450 mm. The total substrate thickness may range from 250 microns to 1500 microns, though in particular embodiments the substrate thickness is in the range of 725 to 775 microns, which corresponds to thickness dimensions commonly used in silicon CMOS processing.

In various embodiments, a hard mask 200 is disposed over, e.g., directly over the SOI layer 106. The hard mask 200 may be formed using any conventional deposition technique, such as, for example, chemical vapor deposition (CVD), plasma-enhanced CVD (PECVD), metal organic chemical vapor deposition (MOCVD), atomic layer deposition (ALD), evaporation, reactive sputtering, chemical solution deposition, spin-on deposition, thermal oxidation, or other like processes. For instance, the hard mask 200 can be formed by a low pressure chemical vapor deposition (LPCVD) process using silane ($SiH_4$) or a halogenated silane precursor.

In certain embodiments, the hard mask 200 includes a first layer 202 and a second layer 204 overlying the first layer 202. The first layer 202 may be composed of an oxide, a nitride, or an oxynitride and may promote adhesion of the hard mask 200 to the SOI layer 106, and the second layer 204 may be composed of an oxide, a nitride, or an oxynitride, for example. In particular embodiments, the first layer 202 comprises a pad oxide layer such as a silicon dioxide layer and the second layer 204 comprises a pad nitride layer such as a silicon nitride layer. The hard mask 200 can have a thickness ranging from 40 nm to 200 nm.

The hard mask 200 may be patterned and etched to form one or more preliminary openings (not shown) in the hard mask to expose a portion of the SOI layer 106. The patterning process may comprise photolithography, which includes forming a layer of photoresist material (not shown) atop a material or material stack to be patterned. The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. In the instant embodiment, this provides a patterned layer of photoresist atop a portion of the hard mask 200. The pattern provided by the patterned photoresist material is thereafter transferred into the underlying material layer or material layers utilizing at least one pattern transfer etching process.

As seen in FIG. 1, a portion of the SOI layer 106 and the isolation layer 104 may be removed selective to the hard mask 200 below the one or more preliminary openings. The pattern transfer etching process may include an isotropic or an anisotropic etch. In embodiments, a dry etching process such as, for example, reactive ion etching can be used. In other embodiments, a wet chemical etchant can be used. In still further embodiments, a combination of dry etching and wet etching can be used.

The pattern transfer etching may stop on the isolation layer 104 forming an isolation trench 300. In certain embodiments, the isolation trench 300 may be formed using a single-step or a multi-step etching process that successively removes individual layers 204, 202, 106 and a portion of isolation layer 104. Thus, the isolation trench 300 passes completely through the hard mask 200 and the SOI layer 106 and partially through the isolation layer 104. In various embodiments, formation of the isolation trench includes etching through at least 50% of the thickness of the isolation layer 104, e.g., 50, 60, 70, 80, 90 or 95% of the thickness, including ranges between any of the foregoing values. In example embodiments, the width (L) of the isolation trench may range from 0.2 to 2 microns, e.g., 0.2, 0.4, 0.5, 1, 1.5 or 2 microns, including ranges between any of the foregoing values.

The sidewalls of each isolation trench 300 can be substantially vertically coincident among the various layers (204, 202, 106, 104) through which the isolation trench 300 extends. As used herein, sidewalls of multiple elements are "vertically coincident" if the sidewalls of the multiple elements overlap in a top-down view. As used herein, sidewalls of multiple elements are "substantially vertically coincident" if the lateral offset of the sidewalls of the multiple elements from a vertical surface is less than 5 nm.

Figure 2:
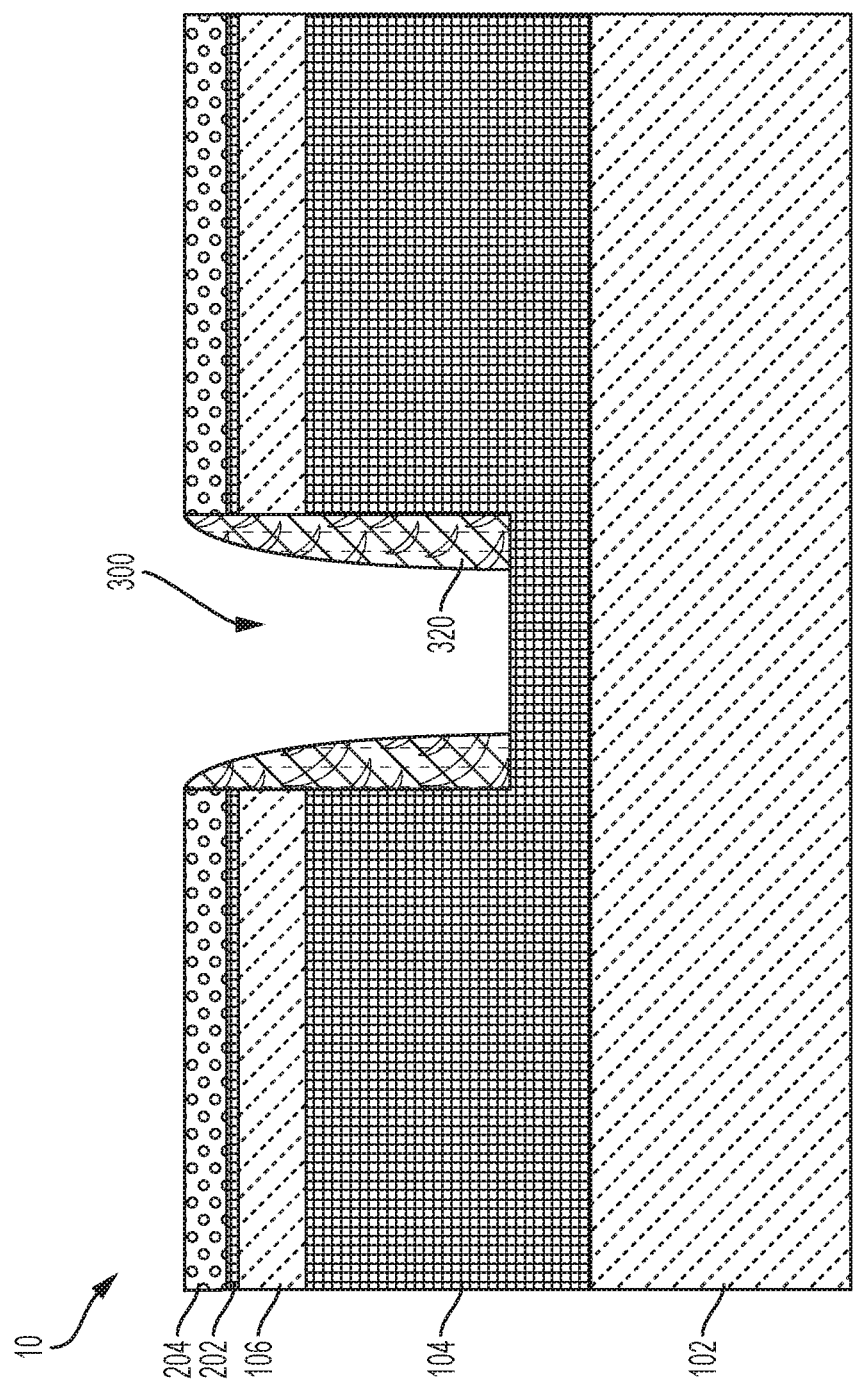
FIG. 2 depicts the formation of sidewalls spacers within the isolation trench.

Referring to FIG. 2, a spacer 320 is formed on sidewalls of the isolation trench 300. The spacer 320 may comprise, for example, silicon nitride, silicon dioxide, silicon oxynitride, or a combination thereof, and may be formed by any method known in the art, including deposition of a conformal layer of spacer material followed by an anisotropic etch to remove unwanted portions thereof, e.g., removal of the spacer material from a majority of horizontal surfaces to form a spacer 320 disposed over exposed sidewalls of the hard mask 200, SOI layer 106 and isolation layer 104. The spacer 320 may be deposited using CVD, PECVD, MOCVD, ALD, evaporation, reactive sputtering, chemical solution deposition, spin-on deposition, or other like process. The spacer 320 may have a thickness, as measured at a base thereof, of 1 nm to 100 nm.

Figure 3:
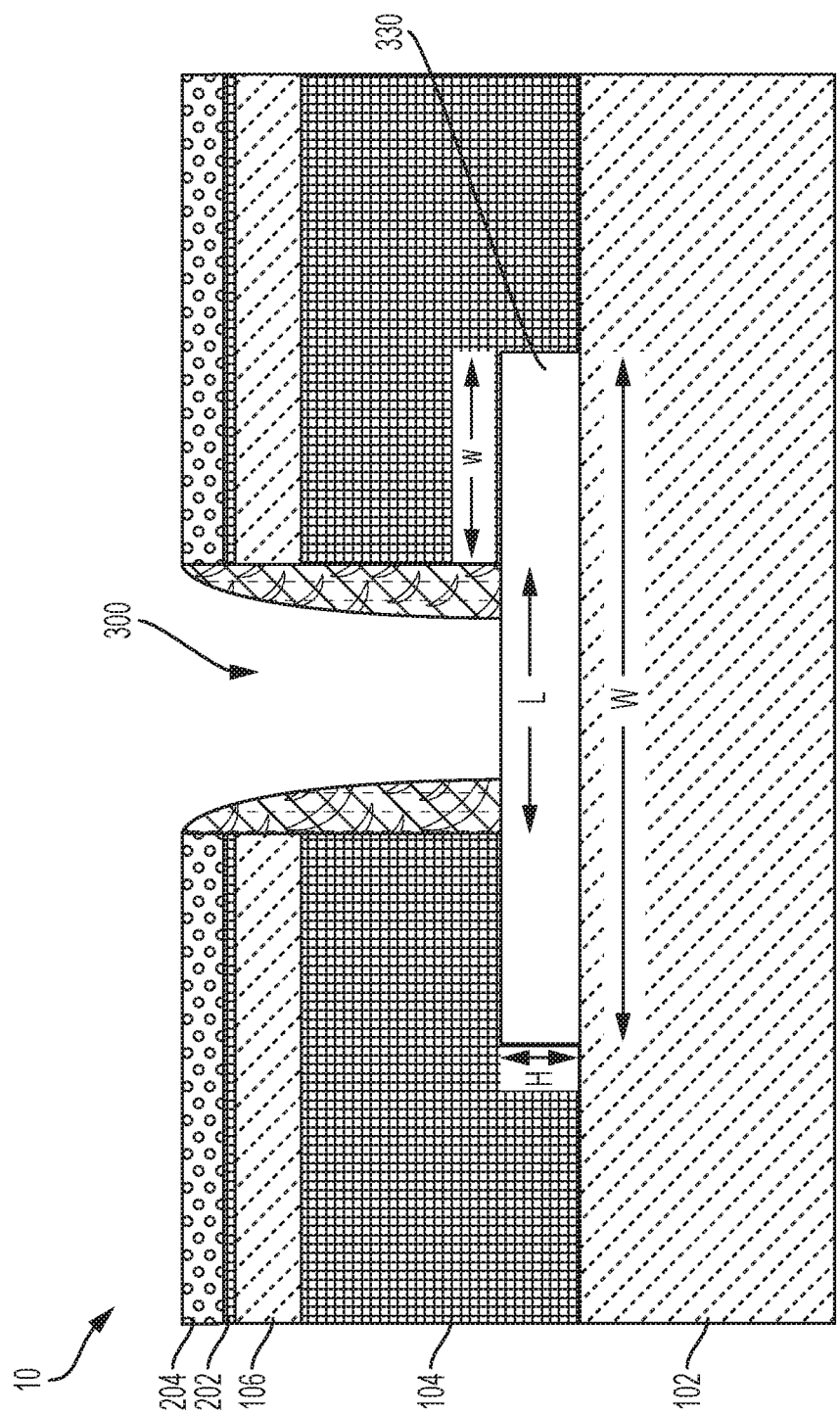
FIG. 3 shows the formation of a lateral cavity extending from the isolation trench into the isolation layer above the handle portion of the substrate.

Referring to FIG. 3, exposed portions of the isolation layer 104 at the bottom of the isolation trench 300 are selectively etched with respect to the spacer 320 and the handle portion 102 of the substrate 100 to form a lateral cavity (i.e., a lateral trench) 330. For instance, in certain embodiments, a wet or dry etch may be used to remove a portion of the isolation layer 104 selective to nitride and silicon. An example etchant may include HF. The lateral cavity-defining etch may be an isotropic or an anisotropic etch.

The lateral cavity 330 extends into the isolation layer over the handle portion 102 and undercuts a portion of the SOI layer 106 adjacent to the isolation trench 300 such that the sidewalls and the upper surface of the lateral cavity are defined by the isolation layer 104 while a lower surface of the lateral cavity 330 is defined by handle portion 102.

Lateral cavity 330 has a height (H) and a total width (W), including an undercut width (w) that directly underlies the isolation layer 104. The height (H) of the lateral cavity may range from 2.5 to 1900 nm, e.g., 2.5, 5, 10, 20, 30, 50, 100, 200, 300, 500, 1000, 1500 or 1900 nm, including ranges between any of the foregoing values. The undercut width (w) may range from 1 to 10 microns, e.g., 1, 2, 3, 4, 5 or 10 microns, including ranges between any of the foregoing values. In various embodiments, the lateral cavity is symmetrical with respect to isolation trench 300.

Figure 4:
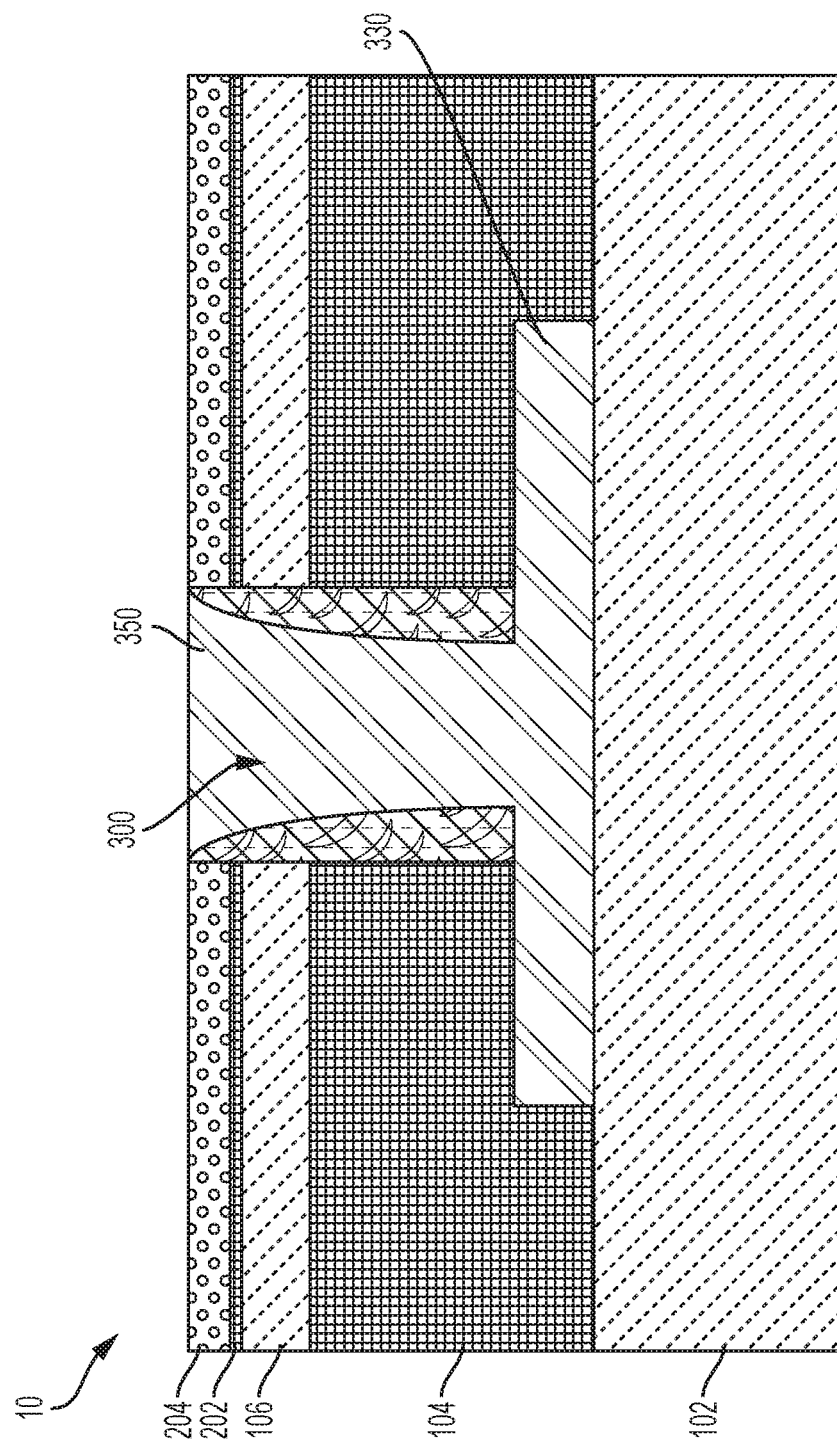
FIG. 4 shows the deposition of a trap-rich polysilicon layer into the isolation trench and the lateral cavity of FIG. 3.

Referring to FIG. 4, a trap-rich polysilicon layer 350 is deposited into the isolation trench 300 and the lateral cavity 330. In various embodiments, the polysilicon layer 350 substantially fills the isolation trench 300 and the lateral cavity 330 without any voids or gaps and is adapted to underlie at least a portion of the gate of a transistor to be manufactured on the substrate. The trap-rich polysilicon layer 350 is not a blanket layer of polysilicon disposed between the isolation layer and the handle portion 102 of the substrate, but defines a localized trap-rich region that provides horizontal and vertical isolation for an adjacent device. Thus, in certain embodiments, the trap-rich polysilicon layer 350 encroaches beneath only a portion of the device. Further, the trap-rich polysilicon layer 350 is not formed using ion implantation, but is deposited as polysilicon and according to various embodiments consists essentially of polycrystalline silicon (Si).

The polysilicon layer 350 may be formed using a deposition process such as chemical vapor deposition where polysilicon is formed in situ and grows inward from the sidewalls of the isolation trench 300 and one or more of the exposed walls of the lateral cavity 330. By way of example, a CVD process using silane ($SiH_4$) or other suitable precursor gas as a source of silicon may be performed at a temperature of 550-650° C. and a pressure of 10 to 200 mTorr. As another example, an ultra-high vacuum ("UHV") CVD process may be used. During such a process, the deposition pressure is typically less than $1 \times 10^{-7}$ Torr. In various embodiments, the trap-rich polysilicon layer 350 may include an air-gap.

As used herein, the term "trap-rich layer" or "trap-rich polysilicon layer" refers to a layer having a high density of electrically-active carrier traps. The incorporation of the trap-rich polysilicon layer 350 into the substrate can significantly decrease the carrier lifetime and mobility of free charge carriers, which maintains the effective resistance of the substrate. A high trap density within the trap rich layer 350 can effectively minimize or eliminate nonlinear parasitic capacitance, parasitic surface conduction, and the formation of an inversion layer between the isolation layer and the handle portion 102 of the substrate under the influence of an applied RF field. Without wishing to be bound by theory, the inversion layer and the induced oscillation frequency of charge carriers (e.g., electrons) can induce unwanted harmonic distortion in an adjacent device. In some embodiments, the trap rich layer 350 has a trap density of greater than $10^{10}$ $cm^2$ $eV^{-1}$. In contrast to ion implantation or other methods of forming a trap-rich layer, embedding the trap rich layer within the substrate by etching and backfilling a lateral cavity 330 avoids substantial damage to a majority of the SOI layer 106, which will define the active layer of a semiconductor device, such as a switch FET.

As shown in FIG. 4, after the polysilicon layer 350 is deposited, the structure 10 may be subjected to a planarization process, such as, for example, chemical mechanical planarization (CMP) so that an upper surface of the polysilicon layer 350 may be substantially co-planar with an upper surface of the hard mask 200.

Figure 5:
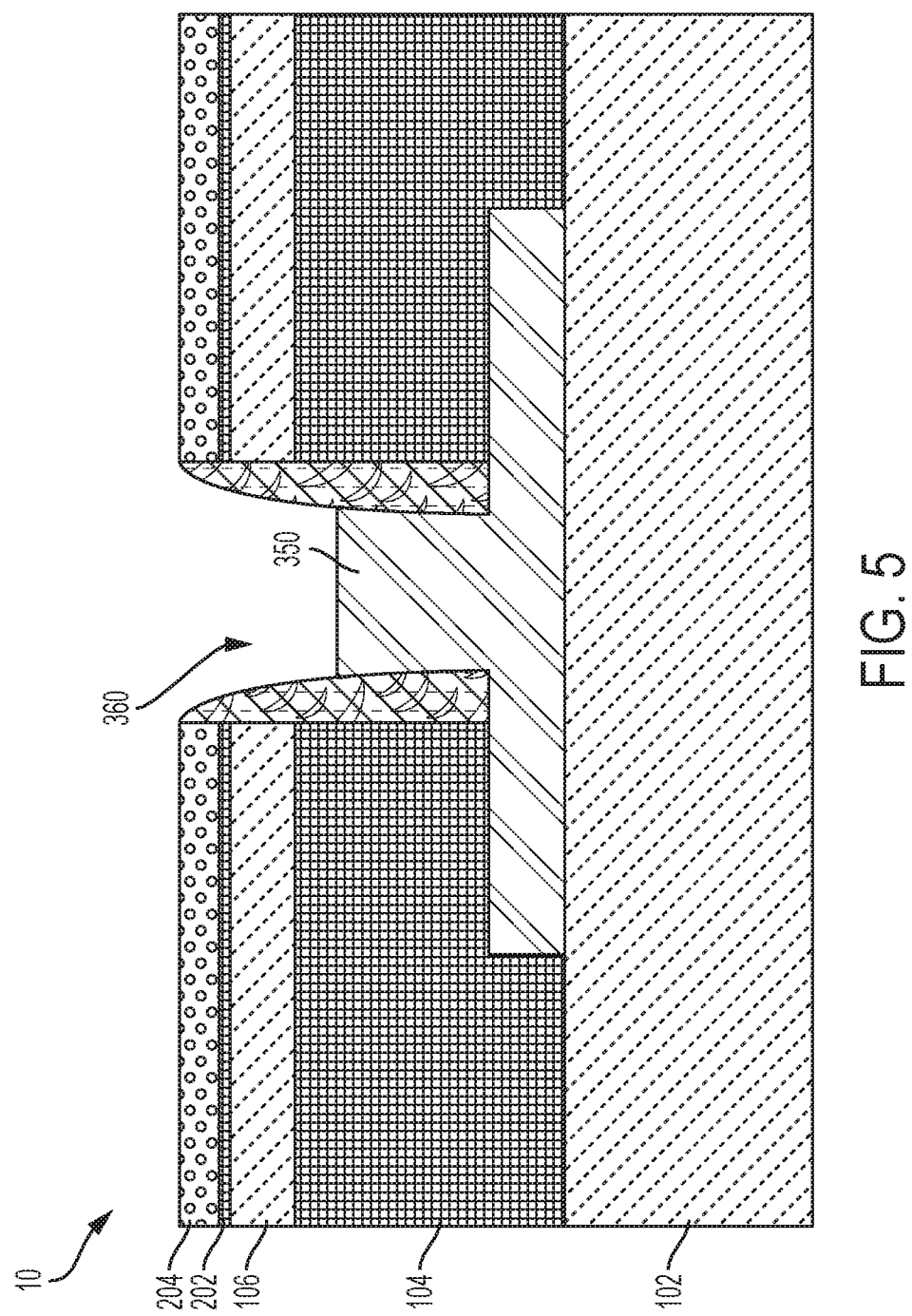
FIG. 5 shows the structure of FIG. 4 after partially recessing the trap-rich polysilicon layer within the isolation trench.

Referring now to FIG. 5, a cross-sectional view of the structure 10 illustrates the formation of a recess or shallow trench 360 in the polysilicon layer 350 within the isolation trench 300. The recess 360 may be formed by etching the exposed polysilicon layer 350 selective to the sidewall spacer 320 and the hard mask 200. In various embodiments, the recess 360 may be formed by performing an anisotropic wet etch using an etchant comprising, for example, $NH_4OH$. In further embodiments, the recess 360 may be formed by way of a reactive ion etch using, for example, an etch chemistry comprising $SF_6$ or HBr. According to certain embodiments and as illustrated in FIG. 5, following the recess etch the upper surface of the polysilicon layer 350 is below a top surface of the SOI layer 106, i.e., below a top surface of the isolation layer 104.

The hard mask layer 200 is then patterned to form a mask for additional shallow trench etching, which includes photoresist deposition, lithography and resist development, etching, and post-etch resist removal. Shallow trench isolation (STI) openings that extend through the SOI layer 106 to a top surface of the isolation layer 104 are formed laterally spaced from the trap-rich polysilicon layer 350. In certain embodiments, the STI etch removes a portion of the isolation layer 104 at the bottom of the STI openings.

The recess 360 and the openings of the shallow trenches are then filled with a dielectric layer 365. In some embodiments, the same dielectric layer deposition step can be used to fill the recess 360 over polysilicon layer 350 and the laterally-spaced STI structures. The dielectric layer 365 may comprise silicon dioxide, which can be deposited into the recess 360 and the trenches by a CVD process. For instance, a layer of silicon dioxide may be formed by a high density plasma chemical vapor deposition (HDPCVD). Alternately, a layer of silicon dioxide may be formed by a high aspect ratio process (HARP).

In further embodiments, the recess 360 and the shallow trench openings may be filled with other suitable materials, such as silicon nitride, silicon oxynitride, a low-k material, an air gap, or combinations thereof, to form trench isolation features. For instance, the trench isolation features may comprise a multi-layer structure of two or more of the foregoing materials.

Exemplary low-k materials include but are not limited to, amorphous carbon, fluorine-doped oxides, carbon-doped oxides, SiCOH or SiBCN. Commercially-available low-k dielectric products and materials include Dow Corning's SiLK™ and porous SiLK™, Applied Materials' Black Diamond™, Texas Instrument's Coral™ and TSMC's Black Diamond™ and Coral™. The interconnect-level dielectric material layer 510 may be deposited by plasma enhanced chemical vapor deposition (PECVD), for example.

After the dielectric layer 365 is deposited, an optional anneal may be used to densify the dielectric layer 365. The densification process can be performed in a furnace or a rapid thermal annealing (RTA) chamber. In some embodiments, the post gap fill anneal is performed at a temperature ranging from 900° C. to 1200° C. in a RTA chamber for a duration of 10 seconds to 5 minutes.

Figure 6:
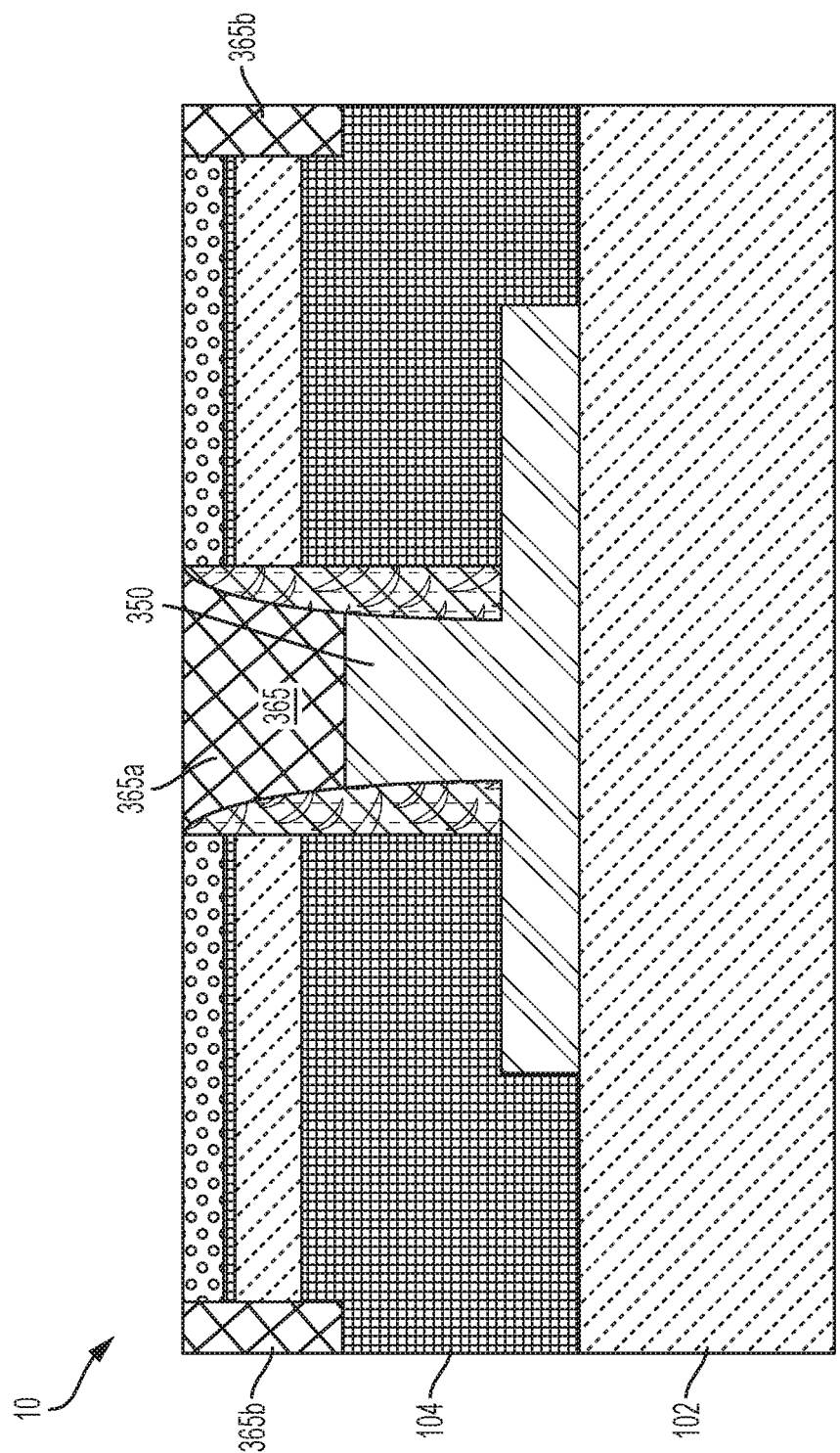
FIG. 6 depicts the formation of shallow trench isolation features over the trap-rich polysilicon layer and laterally spaced from the trap-rich polysilicon layer.

Referring to FIG. 6, after filling the trenches, the structure undergoes a planarization process to remove excess dielectric material. In some embodiments, a chemical mechanical polishing (CMP) process is used to remove the over burden and form a global planarized surface. As one example, the CMP process may use the hard mask 200 as a polishing stop layer so that the polished dielectric layer 365 is substantially coplanar with a top surface of the hard mask 200. Alternatively, an etch-back process may be used to remove the excessive trench-filling dielectric layer and form a global planarized surface.

FIG. 6 shows the structure 10 in accordance with certain embodiments after a CMP process using the hard mask 200 as a CMP stop layer. The structure includes trench isolation layer 365a disposed directly over the localized trap-rich layer 350, i.e., within isolation trench 300, and additional shallow trench isolation layers 365b displaced laterally from the isolation trench 300. In certain embodiments, a bottom surface of trench isolation layers 365a, 365b lie below a top surface of isolation layer 104.

After isolation structures 365a, 365b are formed, well implants into SOI layer 106 precede formation of a gate architecture. In certain embodiments, hard mask 200 is removed and a sacrificial oxide layer (not shown) is deposited over the SOI layer to facilitate ion implantation into the underlying SOI layer 106. In alternate embodiments, when the second layer 204 of the hard mask 200 is a nitride layer and first layer 202 is an oxide layer, the nitride layer can be removed and the first layer 202 can function as a sacrificial oxide layer (screen oxide layer) for the well implantation.

Doping, e.g., by implantation, changes the electron and hole carrier concentrations of an intrinsic semiconductor at thermal equilibrium. A doped layer or region may be n-type or p-type. As used herein, "n-type" refers to the addition of impurities that contribute free electrons to an intrinsic semiconductor. For silicon, example n-type dopants, i.e., impurities, include but are not limited to, antimony, arsenic, and phosphorus. As used herein, "p-type" refers to the addition of impurities to an intrinsic semiconductor that creates a deficiency of valence electrons. For silicon, example p-type dopants, i.e., impurities, include but are not limited to, boron, aluminum, gallium, and indium.

Thus, an implanted region may be doped with arsenic or phosphorus to form an n-type region. In another example, an implanted region may be doped with boron to form a p-type region. The dopant (n-type or p-type) concentration within the wells may range from $1\times10^{19}$ atoms/cm$^3$ to $1\times10^{22}$ atoms/cm$^3$, e.g., $1\times10^{20}$ atoms/cm$^3$ to $1\times10^{21}$ atoms/cm$^3$. A rapid thermal anneal (RTA) or a laser spiked anneal (LSA) may optionally follow the well implant, or may be deferred and performed after an extension implant.

Figure 7:
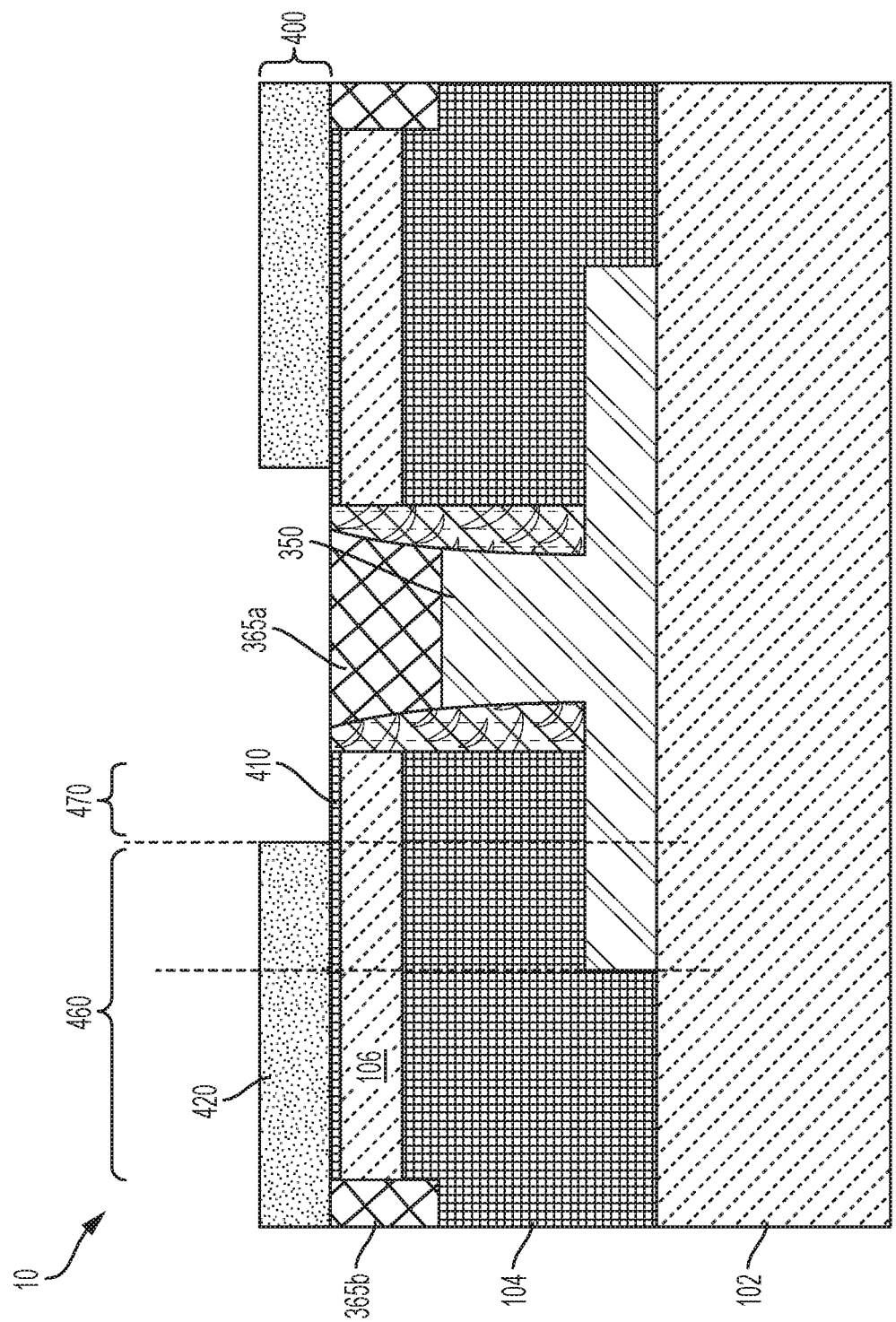
FIG. 7 shows the formation of a gate oxide and patterned polysilicon gate that partially overlap the trap-rich polysilicon layer filling the lateral cavity.

Following well implants, a gate dielectric is deposited directly over the SOI layer 106 and a gate conductor (gate electrode) such as a layer of polysilicon is deposited over the gate dielectric. Referring to FIG. 7, the gate dielectric and polysilicon layer are then patterned to form a gate architecture 400 such that at least a portion of the patterned gate dielectric 410 and the patterned gate electrode 420 overlie the trap-rich layer 350 within the lateral cavity 330. The overlapping portion of the device is indicated in FIG. 7 with vertical dashed lines. The right-most dashed line delineates the boundary between the device active region 460 and the body contacted region 470.

Gate dielectric 410 may comprise silicon dioxide, silicon nitride, silicon oxynitride, a high-k dielectric, or other suitable material. As used herein, a high-k material has a dielectric constant greater than that of silicon dioxide. A high-k dielectric may include a binary or ternary compound such as hafnium oxide (HfO$_2$). Further exemplary high-k dielectrics include, but are not limited to, ZrO$_2$, La$_2$O$_3$, Al$_2$O$_3$, TiO$_2$, SrTiO$_3$, BaTiO$_3$, LaAlO$_3$, Y$_2$O$_3$, HfO$_x$N$_y$, HfSiO$_x$N$_y$, ZrO$_x$N$_y$, La$_2$O$_x$N$_y$, Al$_2$O$_x$N$_y$, TiO$_x$N$_y$, SrTiO$_x$N$_y$, LaAlO$_x$N$_y$, Y$_2$O$_x$N$_y$, SiO$_x$N$_y$, SiN$_x$, a silicate thereof, and an alloy thereof. Each value of x may independently vary from 0.5 to 3, and each value of y may independently vary from 0 to 2.

The gate dielectric 410 may be deposited by a suitable process such as atomic layer deposition (ALD), chemical vapor deposition (CVD), physical vapor deposition (PVD), thermal oxidation, UV-ozone oxidation, or combinations thereof. The gate dielectric thickness may range from 1 nm to 10 nm, e.g., 1, 2, 4, 6, 8 or 10 nm, including ranges between any of the foregoing.

The gate electrode 420 may include a conductive material such as polysilicon, silicon-germanium, a conductive metal such as Al, W, Cu, Ti, Ta, W, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate electrode 420 may comprise one or more layers of such materials such as, for example, a metal stack including a work function metal layer and/or a liner.

The gate electrode 420 can be formed utilizing a conventional deposition process such as, for example, ALD, CVD, metalorganic chemical vapor deposition (MOCVD), molecular beam epitaxy (MBE), PVD, sputtering, plating, evaporation, ion beam deposition, electron beam deposition, laser assisted deposition, or chemical solution deposition.

After defining the gate structure 400, lightly-doped extension regions (not shown) can be formed and optional halo implants performed by implantation into exposed active areas of SOI layer 106, i.e., portions of the SOI layer 106 unmasked by the gate structure 400. A drive-in anneal can be used to diffuse dopant species and generate a desired dopant profile. In embodiments, implanted dopant atoms may be diffused into SOI layer 106 by annealing at a temperature of 600 to 1400° C.

Figure 8:
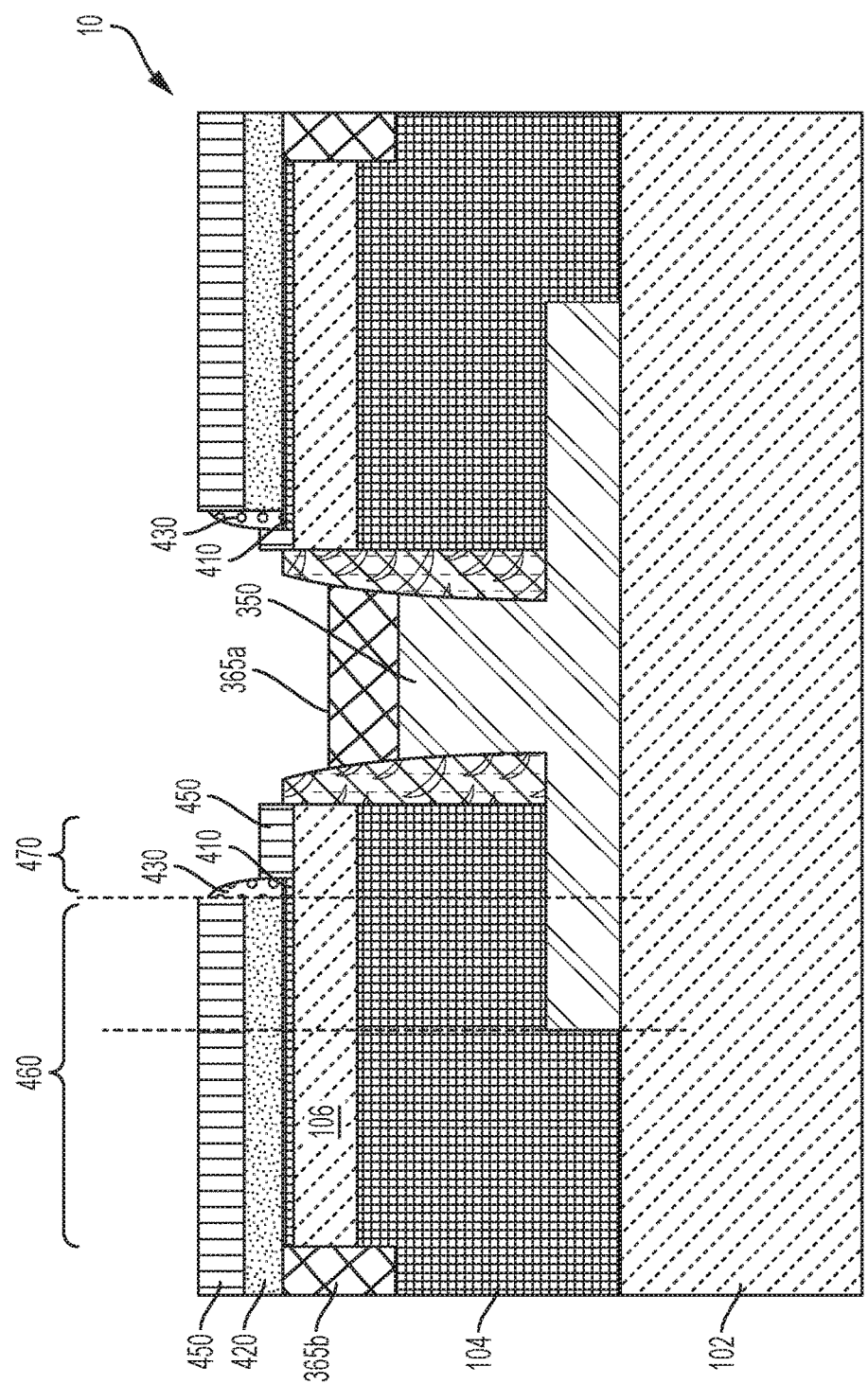
FIG. 8 depicts the formation of source/drain spacers and silicide contacts over the patterned polysilicon gate and the trap-rich polysilicon layer.

Referring to FIG. 8, these device implants are followed by the formation of source/drain spacers 430 and a source/drain implant into SOI layer 106. The gate structure 400 and the source/drain spacers 430, which cooperate to form a mask for the source/drain implant, offset the source/drain implant from the extension/halo implants. To form source/drain spacers 430, which are disposed at least over sidewalls of the gate structure 400, a process analogous to that used to form spacers 320 can be used.

Ion implantation, formation of source/drain spacers 430, and a surface cleaning step are followed by the conformal deposition of a metal layer (not shown), which will be used to form a contact layer comprising a metal silicide. The surface cleaning step may comprise an HF silicide pre-clean, which removes oxygen from the polysilicon gate 420 and the SOI layer 106.

An additional ion implantation step through the layer of metal can be used to further dope the source/drain regions. In embodiments, conformal metal on the sidewalls of the gate can mask a portion of the substrate from receiving this implant. According to various embodiments, the profile of dopants within SOI layer 106 may include one or more implantation species. For instance, one or more implant species may be incorporated into the SOI layer 106 to define the dopant profile for the wells and/or the source/drain regions.

The silicide process for forming contacts typically involves reacting a thin transition metal layer that is in direct contact with an underlying silicon layer to form the silicide. The metal layer can be formed by sputtering, evaporation or chemical vapor deposition. Example transition metals include cobalt, tungsten, nickel, titanium and platinum. The reaction temperature to form the silicide can vary, but is generally sufficient to ensure a suitable reaction between the metal and the silicon without being so high as to damage the device. Following the solid state reaction, excess or unreacted transition metal can be removed using conventional etching processes. Thus, the contacts include a compound of the metal and silicon, e.g., $CoSi_2$, $WSi_2$, $Ni_2Si$, $TiSi_2$, PtSi, etc.

Silicide layers 450 are formed on the polysilicon gate 420 and the SOI layer 106, and optionally on the recessed trap-rich polysilicon region 350. As seen in FIG. 8, contact to the well region within SOI layer 106 beneath gate 420 can be made via silicide layer 450 formed within body contacted region 470, i.e., directly on SOI layer 106.

Figure 9:
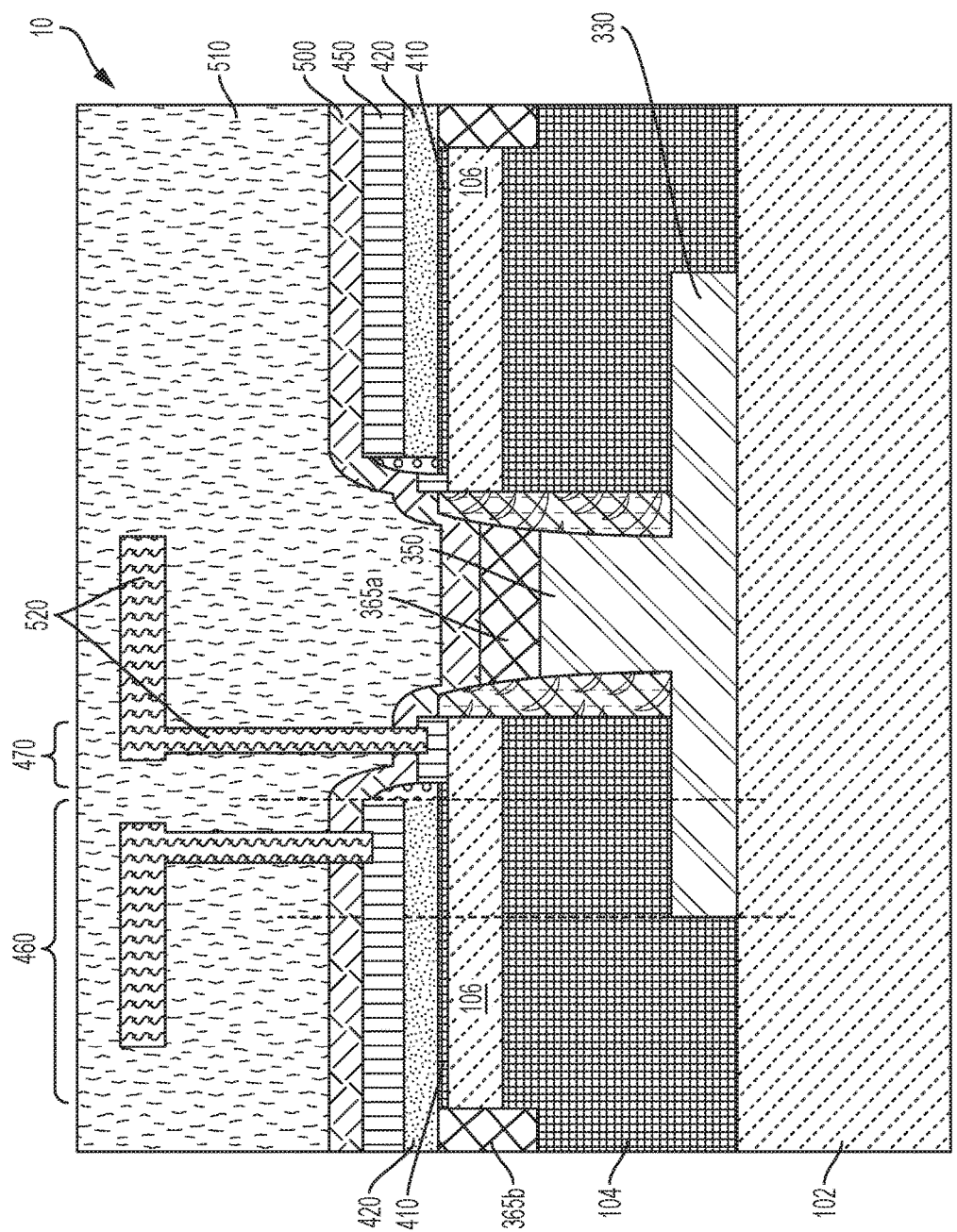
FIG. 9 shows the formation of a barrier layer, interlayer dielectric and contact metallization within an example device architecture where at least a portion of the device active region overlies the trap-rich polysilicon layer.

Referring to FIG. 9, a conformal barrier layer 500 is deposited over exposed surfaces of the structure of FIG. 8. The barrier layer 500 may include a refractory metal nitride such as titanium nitride though other Group IVB or Group VB elements of the Periodic Table may be used. The barrier layer 500 may be formed using chemical vapor deposition (CVD), atomic layer deposition (ALD), or physical vapor deposition (PVD) processes. For instance, during a CVD or ALD process, a silicon precursor may be reacted with a nitrogen precursor (e.g., $SiH_4$ and $NH_3$) to form a silicon nitride ($Si_3N_4$) layer. The thickness of the barrier layer 500 may range from 5 to 60 nm, though thicker barrier layers are contemplated.

Subsequently, an interconnect-level dielectric material layer 510 can be deposited over the barrier layer 500. The dielectric material layer 510 may comprise silicon dioxide, silicon nitride, silicon oxynitride, a low-k material (i.e., a dielectric material having a dielectric constant of less than silicon dioxide), or any suitable combination of these materials.

Various metal interconnect structures 520 can be formed within the dielectric material layer 510. The various metal interconnect structures can comprise any suitable metal and can include, for example, conductive via structures and conductive line structures that extend through the interconnect-level dielectric material layer 510 and, in some instances, through the barrier layer 500 to contact silicide regions 450. An example metal used for the interconnect structures 520 is tungsten.

Referring still to FIG. 9, and in accordance with various embodiments, trap-rich polysilicon layer 350 within the lateral cavity 330 underlies at least a portion of gate 420, i.e., the trap-rich layer underlies a portion of the active region 460 of the device, i.e., between vertical dashed lines. In the illustrated embodiment, the trap-rich layer 350 underlies the entirety of the body contacted region 470.

Figure 10:
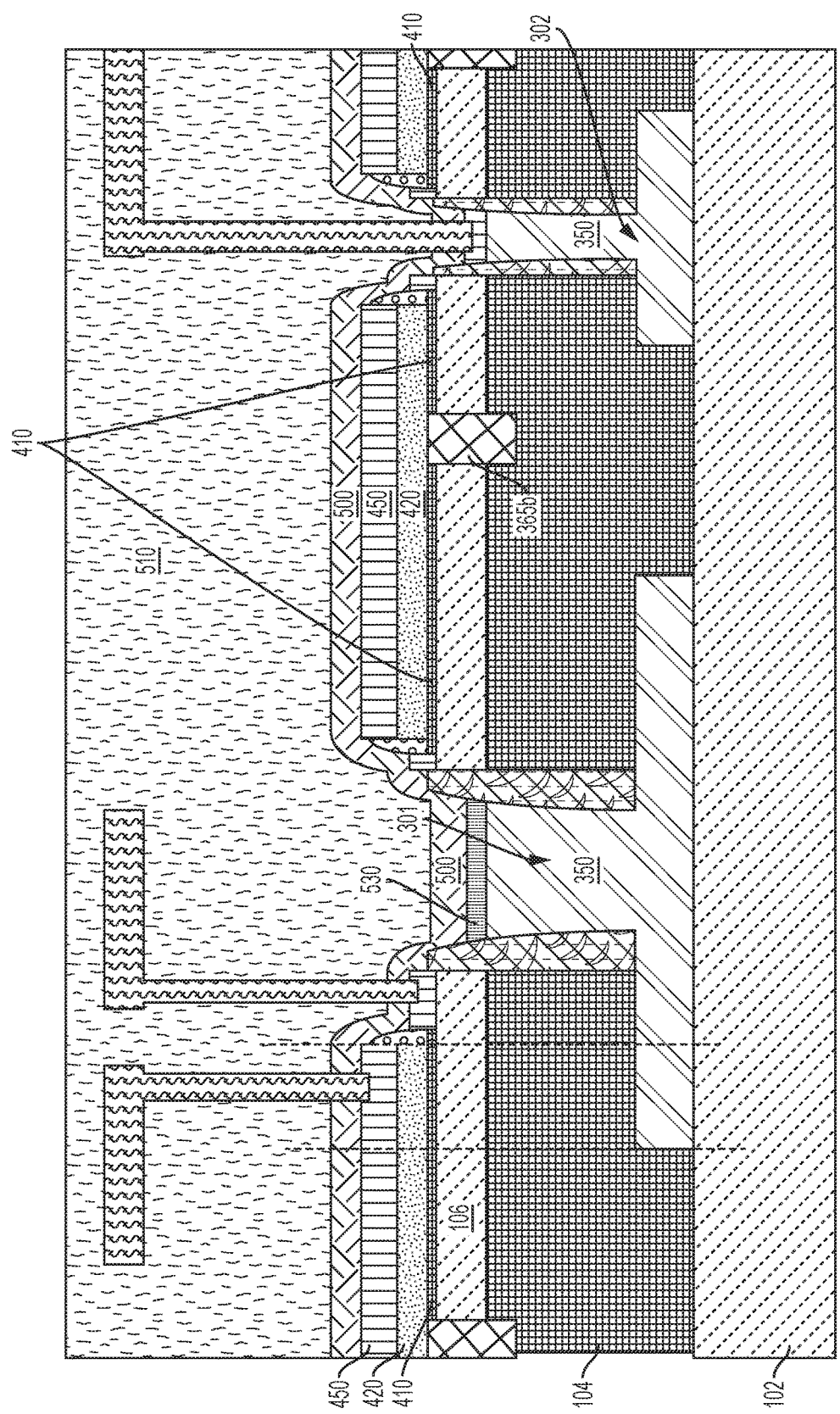
FIG. 10 shows an example device architecture according to further embodiments including a silicide blocking layer disposed over a trap-rich polysilicon layer, and a separate handle wafer contact.

A further embodiment of an isolation structure is shown in FIG. 10. The structure includes a first isolation trench 301 and a second, narrower isolation trench 302. In the embodiment of FIG. 10, the trap-rich polysilicon layer 350 is not recessed within the first isolation trench 301 and shallow trench isolation 365a is not disposed over the associated trap-rich polysilicon layer 350. The absence of a shallow trench isolation layer 365a within first isolation trench 301 may be the result of a surface cleaning step and the attendant removal of the deposited STI material therefrom. Alternatively, the absence of a shallow trench isolation layer 365a within first isolation trench 301 may be the result of masking the region during deposition of the STI material.

In certain embodiments silicidation of polysilicon may be prevented. For instance, as shown in FIG. 10, a silicide blocking layer 530 can be formed over the trap-rich polysilicon layer 350 within isolation trench 300. Example silicide blocking layers 530, which can be incorporated into the final device structure, include silicon nitride ($Si_3N_4$) and silicon oxynitride (SiON).

Referring still to FIG. 10, structure 10 includes a second isolation trench 302. Second isolation trench 302 has an aspect ratio (height/width) greater than 1. According to various embodiments, isolation trenches 300 can have an aspect ratio ranging from 0.2 to 5, e.g., 0.2, 0.25, 0.33, 0.5, 1, 2, 3, 4 or 5, including ranges between any of the foregoing values. Second isolation trench 302 includes a silicide layer 450 disposed directly over trap-rich polysilicon layer 350 within the trench, which provides electrical contact between interconnect structures 520 and the handle portion 102 of the substrate.

As will be appreciated by those skilled in the art, the undercut width (w) of the lateral cavity 330 is generally inversely proportional to the aspect ratio of the isolation trench 300, such that a comparatively narrow lateral cavity is formed from higher aspect ratio trenches. As shown in FIG. 10, the undercut width of the lateral cavity extending from the first isolation trench is greater than the undercut width of the lateral cavity extending from the second isolation trench.

As also shown in FIG. 10, the lateral cavity extending from the first isolation trench 301 and the lateral cavity extending from the second isolation trench 302 are separated from each other by a portion of the isolation layer 104. In other embodiments, a trap-rich polysilicon layer extending laterally from one isolation trench can contact a trap-rich polysilicon layer extending laterally from a second, adjacent isolation trench via a common lateral cavity.

Figure 11:
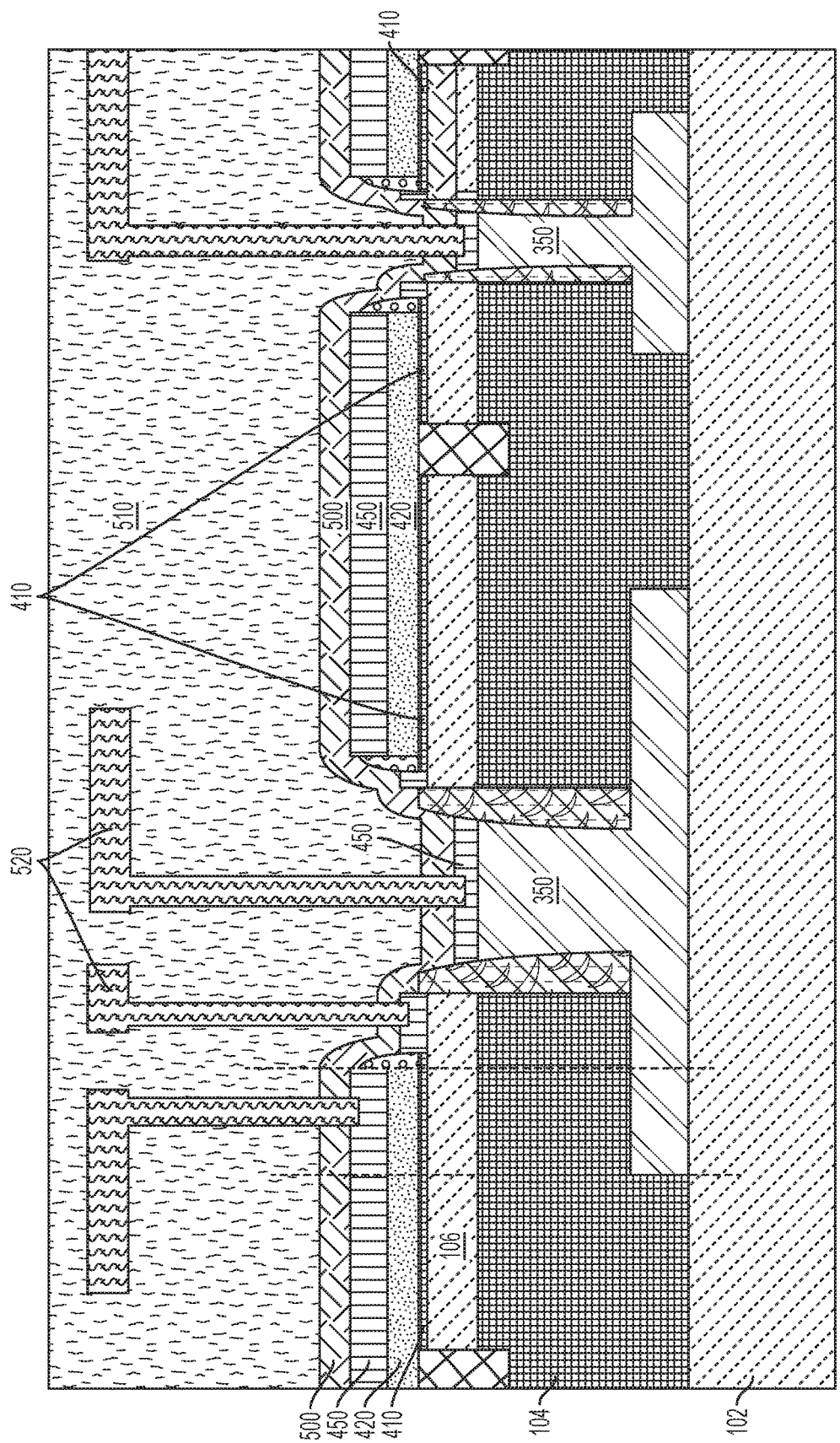
FIG. 11 shows an example device architecture according to still further embodiments including a silicided trap-rich polysilicon layer.

A still further embodiment of the isolation structure is shown in FIG. 11, where electrical contacts are formed via silicided regions 450 to the polysilicon gate 420, SOI layer 106, and trap-rich polysilicon layers 350 within both first and second isolation trenches 301, 302. Trap-rich polysilicon layer 350 within first isolation trench 301 may extend peripheral to an active device region in order to provide RF isolation for the device, while trap-rich polysilicon layer 350 within second isolation trench 302 may extend peripheral to an entire chip in order to prevent the handle wafer from floating to an irregular or anomalously high voltage during use.

Figure 12A:
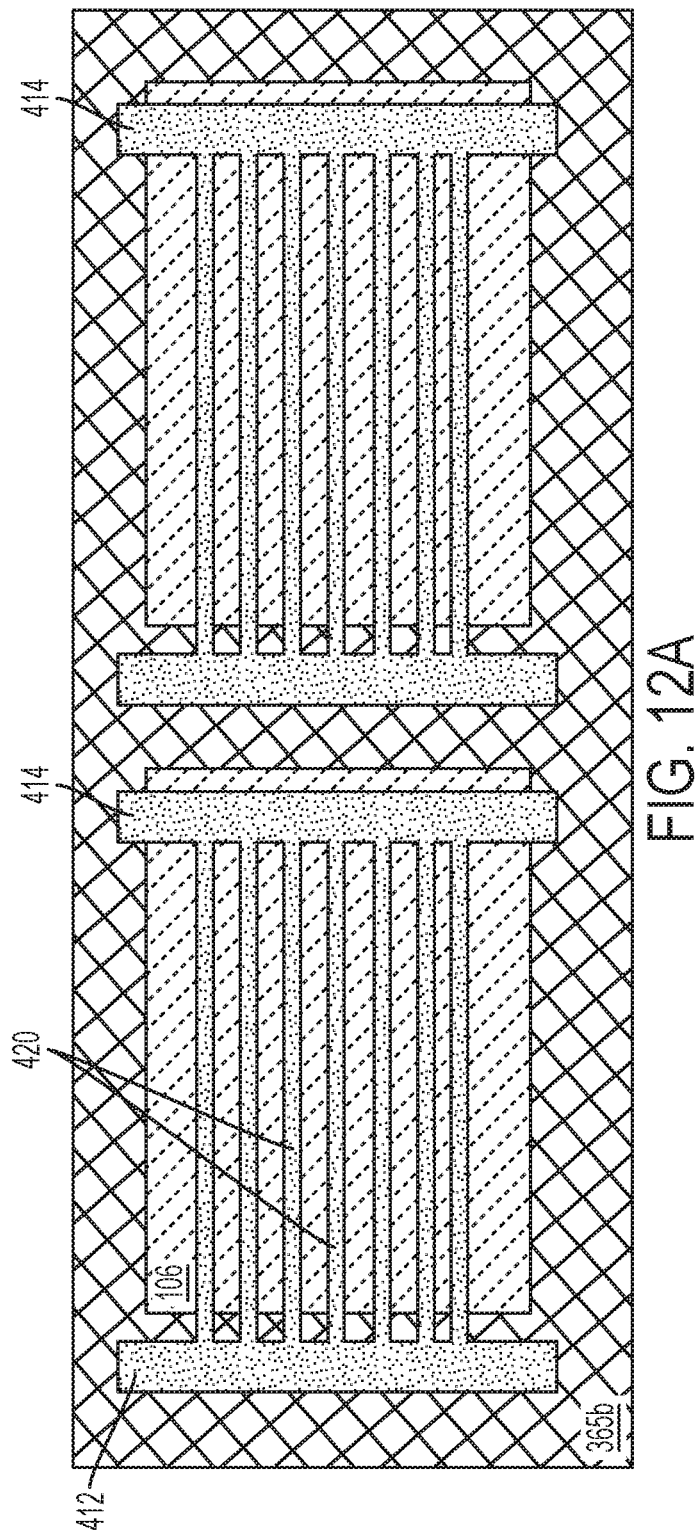
FIG. 12A is a top-down plan view of an example device architecture including a plurality of conductive gates extending over an active device region between opposing switch banks.

A top-down plan view of an example device layout is depicted in FIG. 12A. Adjacent active device layers 106 overlie a semiconductor substrate (not shown) and are surrounded laterally by shallow trench isolation 365b. Active layers 106 may have areal dimensions (i.e., length and width) that range independently from 10 microns to 5 mm. A patterned polysilicon layer includes first and second switch banks 412, 414 and a plurality of gates 420 extending therebetween and over the active layer 106. First switch bank 412 overlies shallow trench isolation 365b. Second switch bank 414 at least partially overlies the active layer 106. A body-contacted region 470 is disposed between the second switch bank 414 and the shallow trench isolation.

Figure 12B:
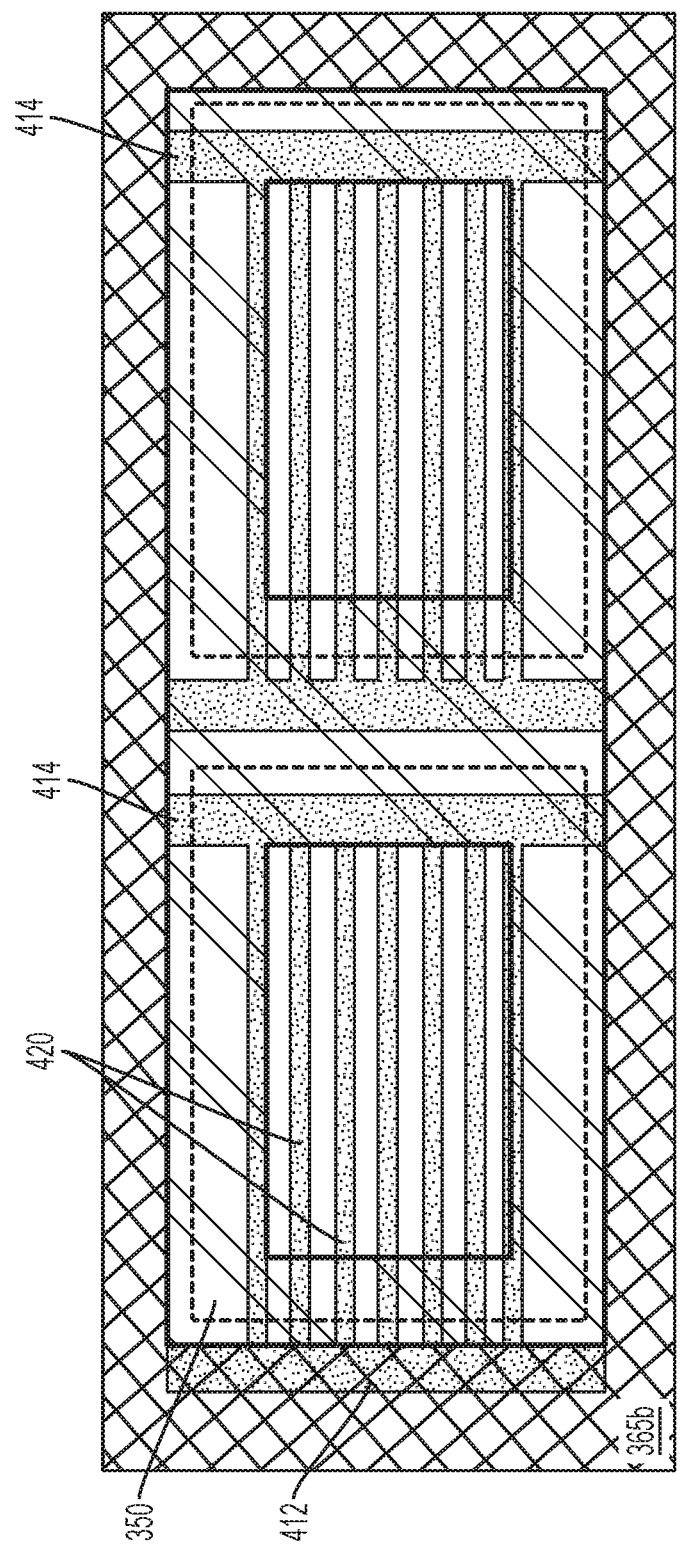
FIG. 12B shows an embedded trap-rich polysilicon layer surrounding and partially underlying the active device region of FIG. 12A.

Referring to FIG. 12B, a trap-rich layer 350 is embedded within the substrate such that a lateral portion of the trap-rich layer underlies a portion, i.e., a peripheral portion of the active layer 106. For instance, active layer 106 may be the active layer of a switch FET. The boundary of the active layer is indicated with a dashed line, which corresponds to the right-most dashed line in FIGS. 8-11. According to certain embodiments, 1% to 80% of the area of the active region is undercut by the lateral portion of the trap-rich layer 350. For example, 1, 2, 5, 10, 20, 50 or 80% of the active area, including ranges between any of the foregoing values, may be undercut.

Figure 12C:
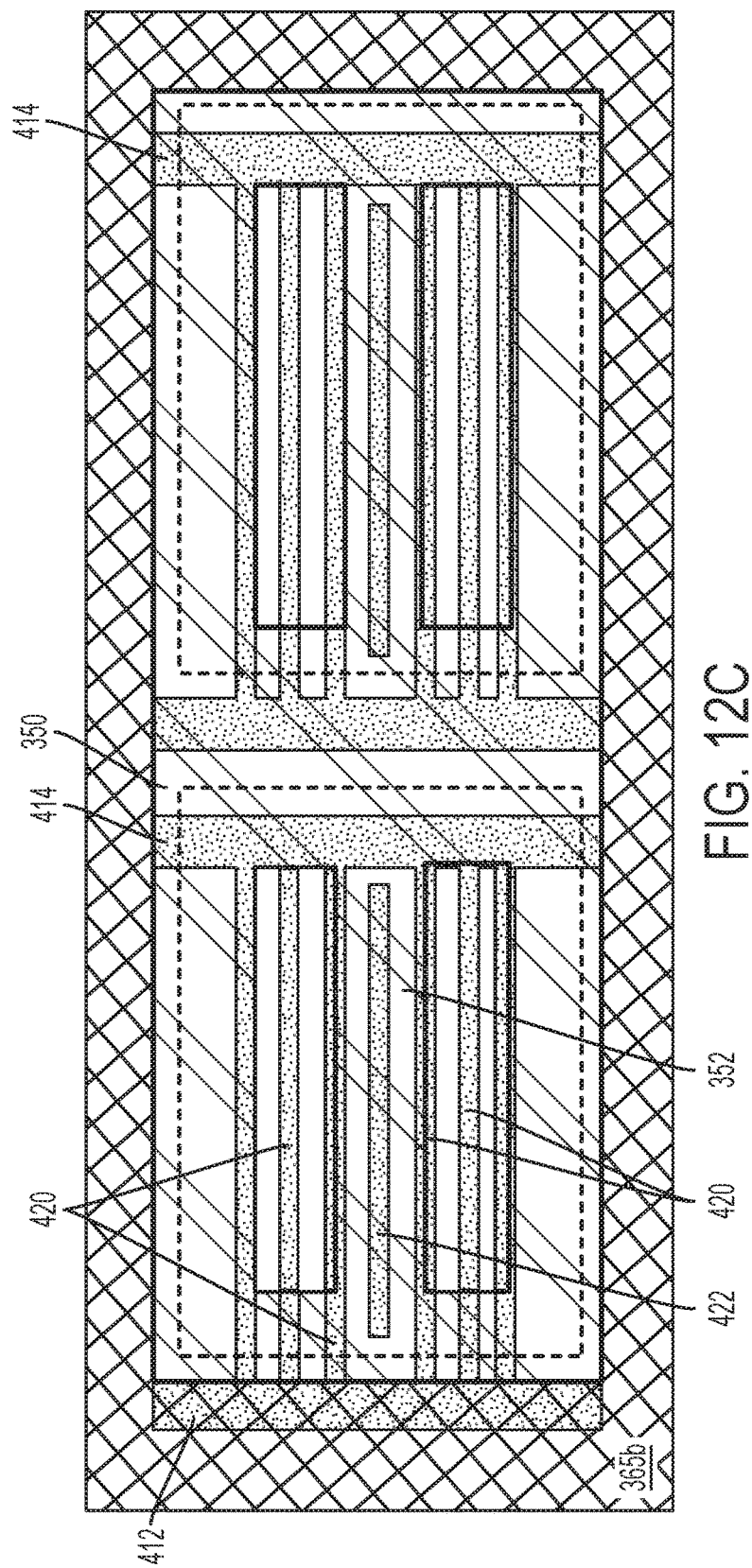
FIG. 12C shows an embedded trap-rich polysilicon layer surrounding, traversing and partially underlying the active device region of FIG. 12A.

Shown in FIG. 12C is a top-down plan view of an isolation structure according to further embodiments. In FIG. 12, an intra-device trap-rich layer 352 traverses the device active region 106 and is disposed beneath a dummy gate 422.

Disclosed is a trap-rich layer generally interposed between the active (SOI) layer and the underlying handle portion of a semiconductor substrate to prevent or mitigate parasitic surface conduction effects within the active layer and underlying handle wafer. In various embodiments, the trap-rich layer extends vertically through a portion of the isolation layer and laterally therefrom to provide both vertical and horizontal RF isolation.

The architecture of the trap-rich layer can be used in conjunction with a variety of semiconductor devices, including a switch field effect transistor (switch FET). For instance, a field effect transistor can be used as a switch by operating the device in either a cutoff region, where a gate source voltage ($V_{gs}$) is less than a pinch-off voltage ($V_p$) and therefore the drain current ($I_d$) is zero, or a saturation region, where the gate source voltage is greater than the difference between the gate source voltage and the pinch-off voltage, i.e., $V_{gs} > V_{gs} - V_p$. In the latter condition, the drain current ($I_d$) is a function of $V_{gs}$ and is independent of the voltage applied to the drain.

Thus, when $V_{gs}=0$, for example, the FET operates in the saturation region and maximum current flow through the device. Hence, the device operates in a fully switched ON state. On the other hand, when $V_{gs} < V_p$, the FET operates in the cutoff region and with no current flowing, the device operates in a switched OFF state. A FET can be used as a switch in various configurations, including a shunt switch or a series switch.

As used herein, the singular forms "a," "an" and "the" include plural referents unless the context clearly dictates otherwise. Thus, for example, reference to a "trap-rich layer" includes examples having two or more such "trap-rich layers" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a trap-rich layer that comprises polysilicon include embodiments where a trap-rich layer consists essentially of polysilicon and embodiments where a trap-rich layer consists of polysilicon.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:
1. A method of manufacturing a semiconductor device, comprising:
   forming an isolation trench through a first semiconductor layer of a semiconductor substrate and partially through an isolation layer underlying the first semiconductor layer;
   forming spacers on sidewalls of the isolation trench;
   forming a lateral cavity within the isolation layer extending from the isolation trench between a portion of the isolation layer and a second semiconductor layer underlying the isolation layer;
   forming a polysilicon layer within the isolation trench and the lateral cavity;
   forming a gate oxide layer over the first semiconductor layer and overlying the polysilicon layer within the lateral cavity;
   forming a polysilicon gate over the gate oxide layer;
   forming a dielectric layer over the polysilicon gate;
   etching a contact via through the dielectric layer; and
   forming a contact within the contact via in electrical communication with the polysilicon gate, wherein a portion of the first semiconductor layer overlying the polysilicon layer within the lateral cavity comprises an active layer of a switch field effect transistor.

2. The method of claim 1, wherein forming the isolation trench comprises etching through at least 50% of a thickness of the isolation layer.

3. The method of claim 1, wherein the isolation trench is formed peripheral to a portion of the first semiconductor layer.

4. The method of claim 1, wherein the lateral cavity underlies a portion of the first semiconductor layer.

5. The method of claim 1, wherein forming the lateral cavity comprises selectively etching the isolation layer with respect to the spacers, the first semiconductor layer, and the second semiconductor layer.

6. The method of claim 1, wherein the polysilicon layer fills the isolation trench and the lateral cavity.

7. The method of claim 1, wherein the polysilicon layer is formed directly over the second semiconductor layer.

8. The method of claim 1, wherein the polysilicon layer is formed peripheral to and below a portion of the first semiconductor layer.

9. The method of claim 1, further comprising implanting a dopant into the first semiconductor layer to form an active region.

10. The method of claim 1, further comprising etching the polysilicon layer below a top surface of the isolation layer within the isolation trench.

11. The method of claim 10, further comprising forming a second dielectric layer on the polysilicon layer within the isolation trench.

* * * * *